US012338542B2

(12) United States Patent
Bae et al.

(10) Patent No.: US 12,338,542 B2
(45) Date of Patent: Jun. 24, 2025

(54) INGOT GROWING APPARATUS

(71) Applicants: HANWHA SOLUTIONS CORPORATION, Seoul (KR); HANWHA CORPORATION, Seoul (KR)

(72) Inventors: Dong Woo Bae, Seoul (KR); Kyung Seok Lee, Seoul (KR); Young Min Lee, Seoul (KR)

(73) Assignees: HANWHA SOLUTIONS CORPORATION, Seoul (KR); HANWHA CORPORATION, Seoul (KR)

( * ) Notice: Subject to any disclaimer, the term of this patent is extended or adjusted under 35 U.S.C. 154(b) by 290 days.

(21) Appl. No.: 18/028,921

(22) PCT Filed: Sep. 3, 2021

(86) PCT No.: PCT/KR2021/011957
§ 371 (c)(1),
(2) Date: Mar. 28, 2023

(87) PCT Pub. No.: WO2022/065742
PCT Pub. Date: Mar. 31, 2022

(65) Prior Publication Data
US 2023/0332325 A1  Oct. 19, 2023

(30) Foreign Application Priority Data

Sep. 28, 2020 (KR) .................. 10-2020-0126317

(51) Int. Cl.
*C30B 15/14* (2006.01)
*C30B 15/10* (2006.01)
(Continued)

(52) U.S. Cl.
CPC .............. *C30B 15/14* (2013.01); *C30B 15/10* (2013.01); *C30B 29/06* (2013.01); *C30B 30/04* (2013.01)

(58) Field of Classification Search
CPC ......... C30B 15/10; C30B 15/14; C30B 29/04; C30B 29/06; Y10T 117/1068
See application file for complete search history.

(56) References Cited

U.S. PATENT DOCUMENTS 5,571,320 A * 11/1996 Grimes ................... C30B 15/14
117/34
6,080,238 A *  6/2000 Ito .......................... C30B 15/14
117/30

(Continued)

FOREIGN PATENT DOCUMENTS

CN      204305383 U    4/2015
JP      2005-11868 A   1/2005
(Continued)

OTHER PUBLICATIONS

International Search Report for PCT/KR2021/011957 dated Dec. 15, 2021.
(Continued)

*Primary Examiner* — Robert M Kunemund
(74) *Attorney, Agent, or Firm* — Sughrue Mion, PLLC

(57) ABSTRACT

An ingot growing apparatus is disclosed. An ingot growing apparatus according to an embodiment of the present invention comprises: a growth furnace in which a main crucible for receiving molten silicon in order to grow an ingot is disposed; a susceptor formed so as to surround the outer surface of the main crucible and including a plurality of heating members which are electrically insulated from each other; and a heater which generates a magnetic field and heats the plurality of heating members through electromag-
(Continued)

netic induction by the magnetic field, wherein the plurality of heating members form loops along the outer surface of the main crucible.

12 Claims, 17 Drawing Sheets

(51) Int. Cl.
  *C30B 29/06* (2006.01)
  *C30B 30/04* (2006.01)

(56) References Cited

U.S. PATENT DOCUMENTS

| | | | |
|---|---|---|---|
| 10,287,706 B2 * | 5/2019 | Baik | F27B 14/08 |
| 2009/0133617 A1 * | 5/2009 | Iida | C30B 35/00 |
| | | | 117/217 |
| 2013/0224100 A1 * | 8/2013 | Von Dollen | F27B 14/061 |
| | | | 117/30 |

FOREIGN PATENT DOCUMENTS

| | | |
|---|---|---|
| JP | 4288110 B2 | 7/2009 |
| JP | 2009-274926 A | 11/2009 |
| JP | 2017-200868 A | 11/2017 |
| KR | 10-2015-0049327 A | 5/2015 |
| KR | 10-1885210 B1 | 9/2018 |
| KR | 10-2271714 B1 | 7/2021 |
| TW | 237090 B1 * | 8/2005 |

OTHER PUBLICATIONS

Office Action issued Nov. 27, 2024 in Chinese Patent Application No. 202011408528.4.

* cited by examiner

[FIG. 1]
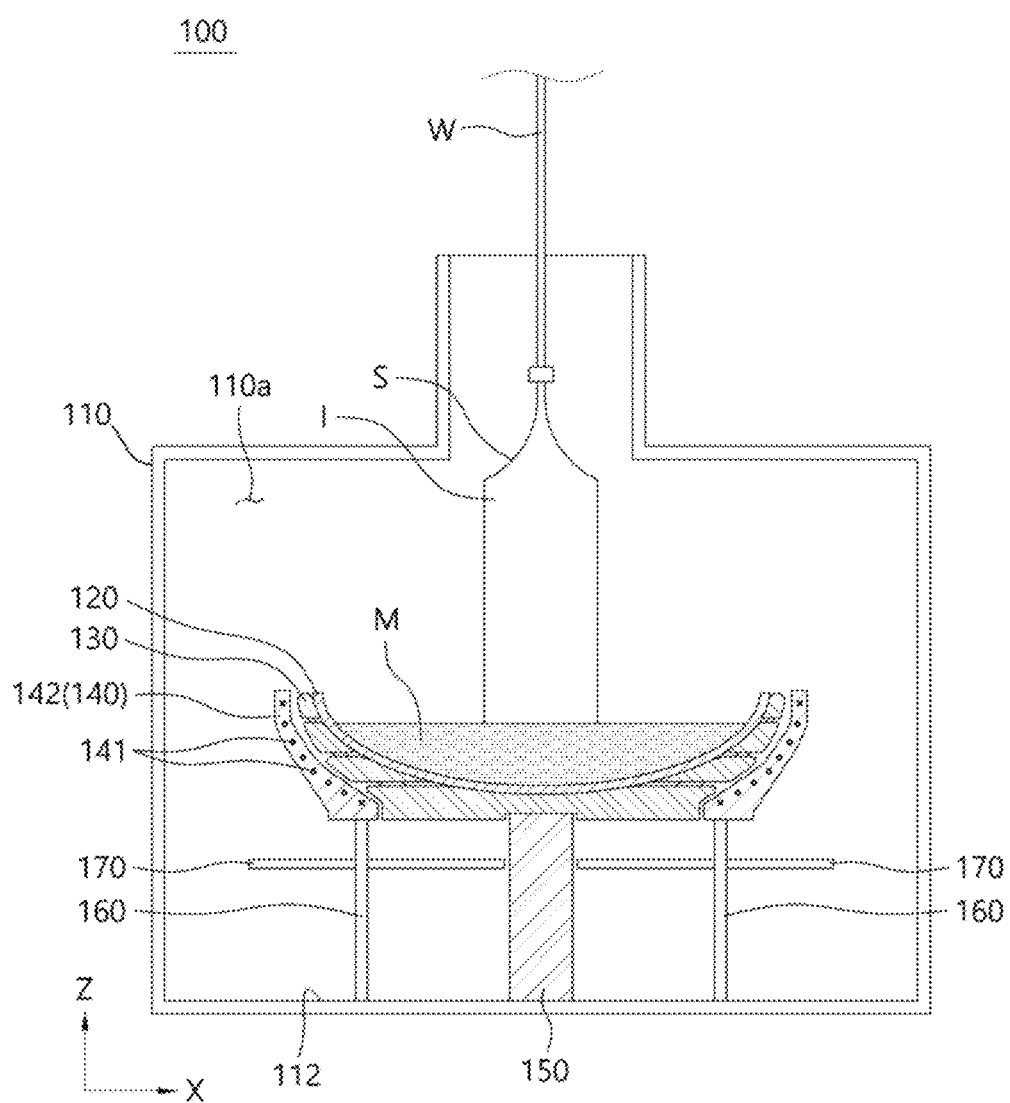

[FIG. 2]
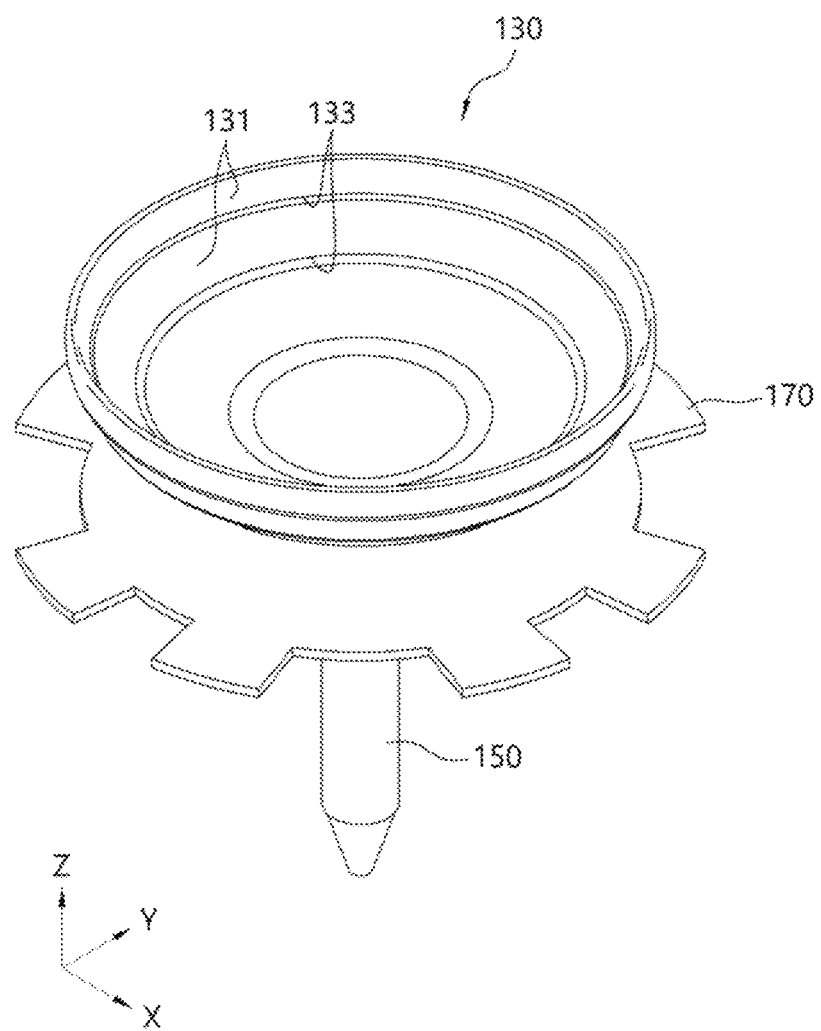

[FIG. 3]
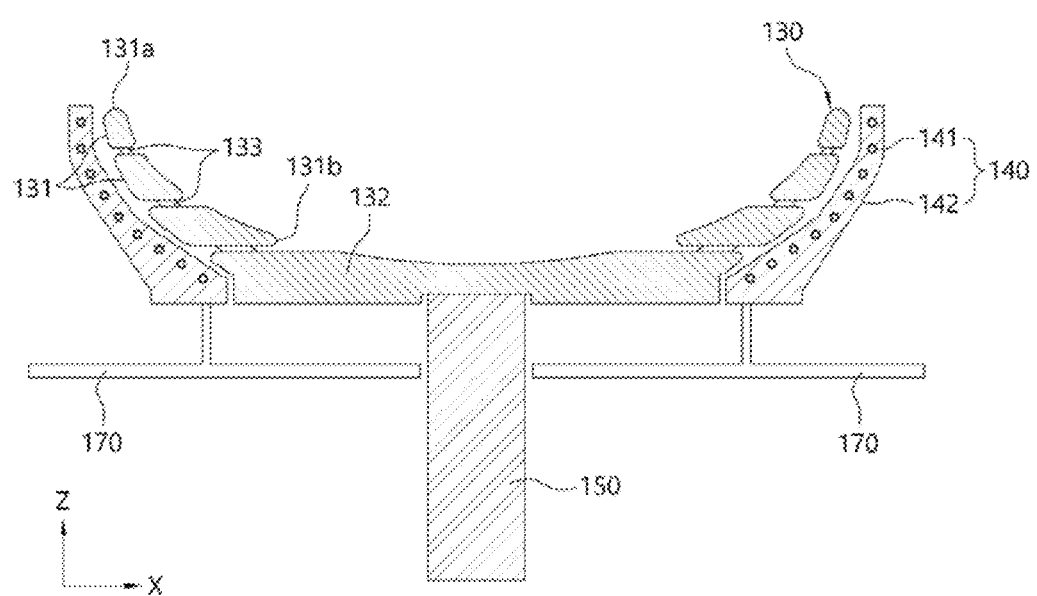

[FIG. 4]
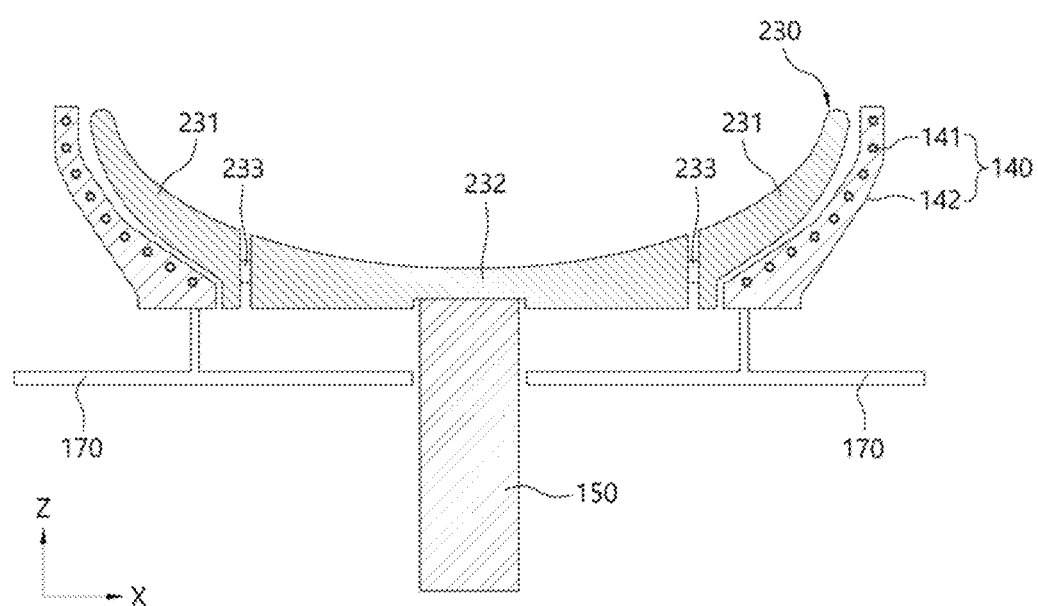

[FIG. 5a]
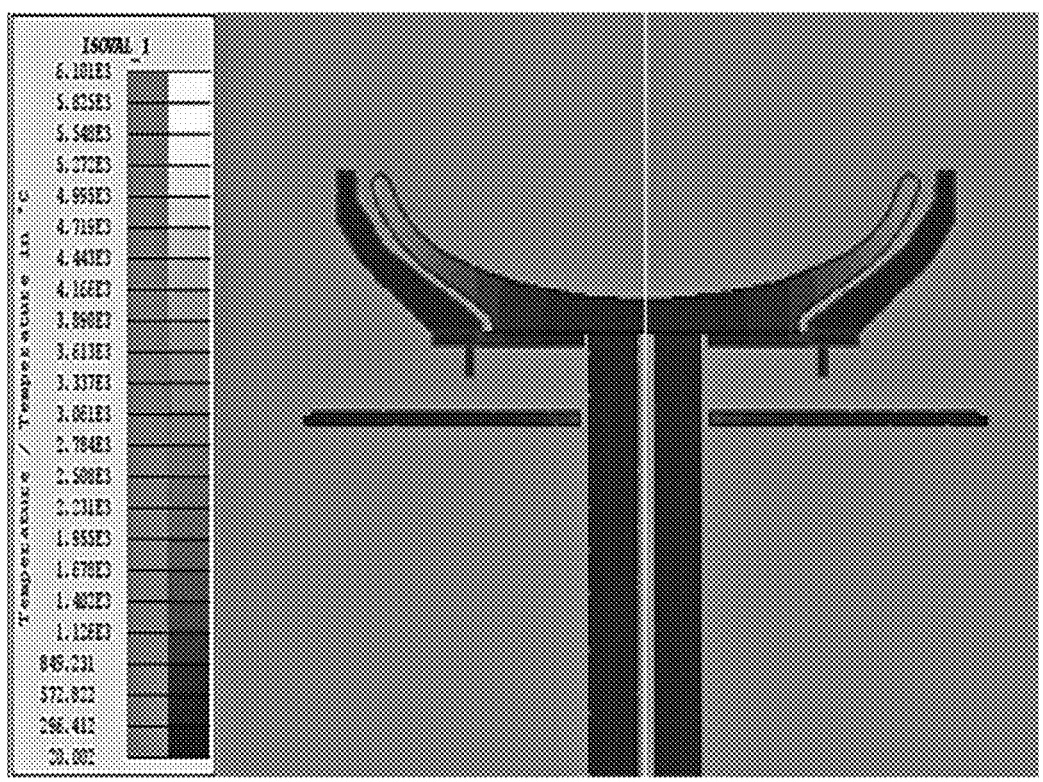

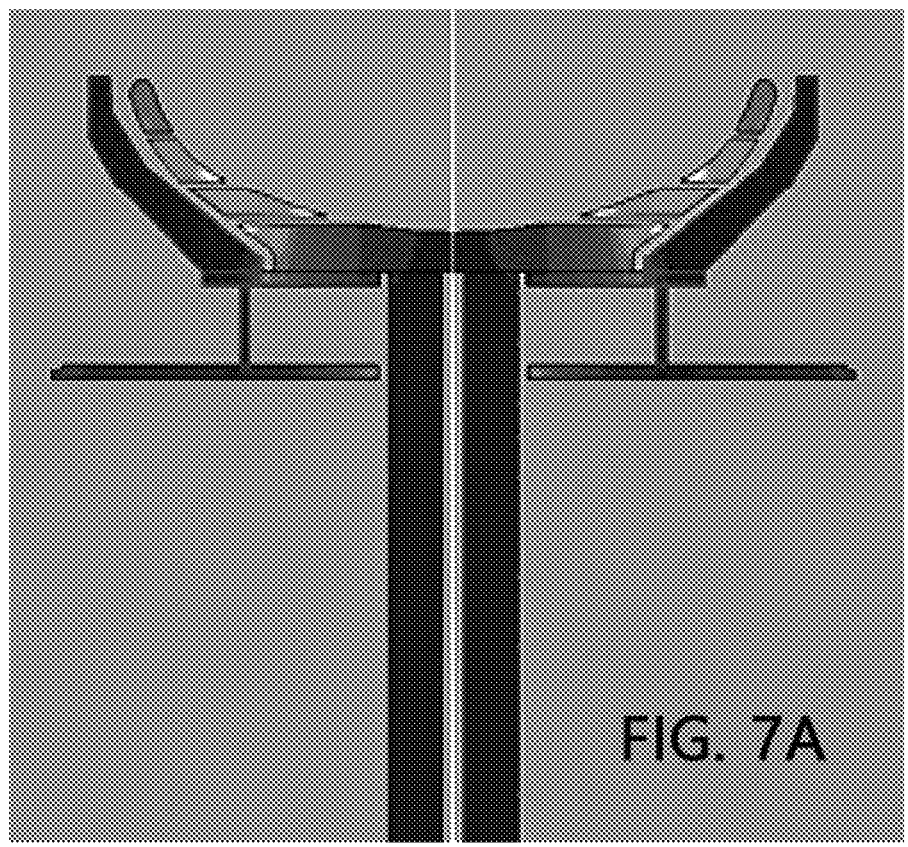

[FIG. 8]
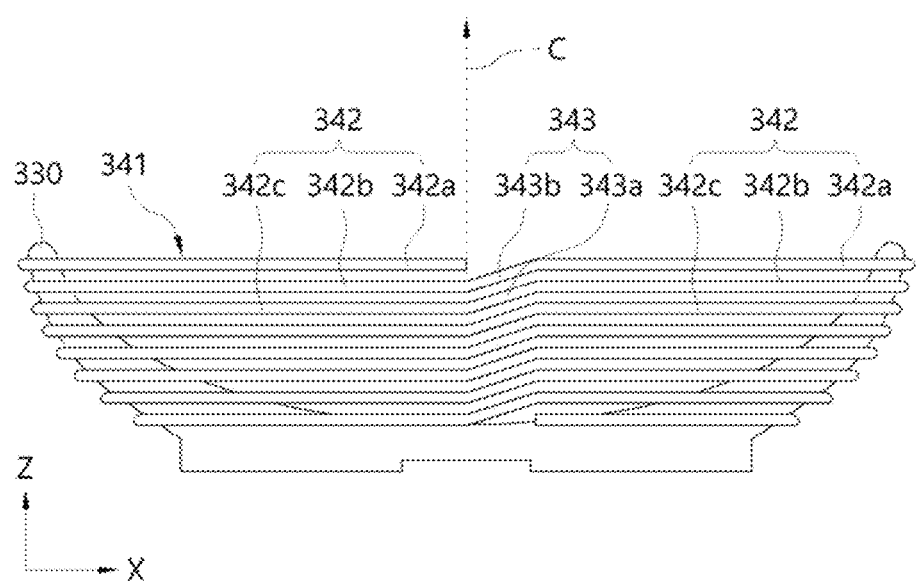

[FIG. 9]
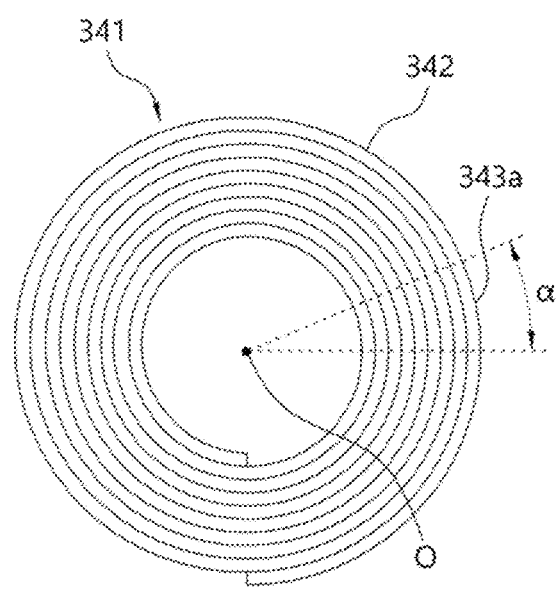

[FIG. 10]
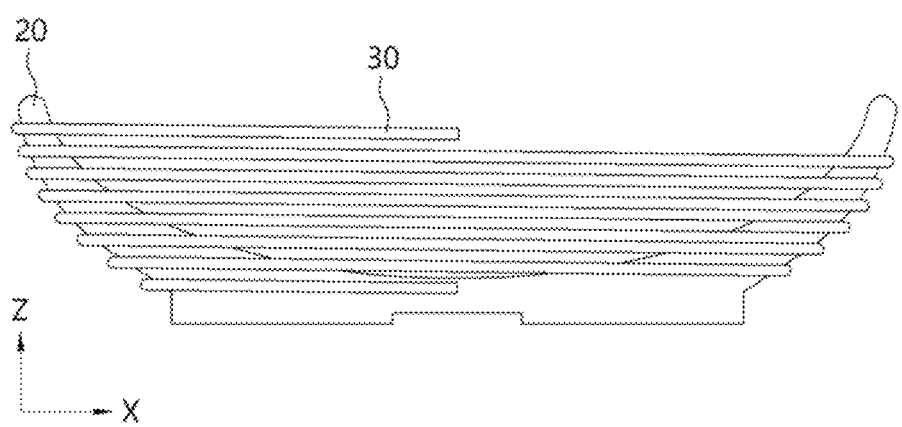

[FIG. 11a]
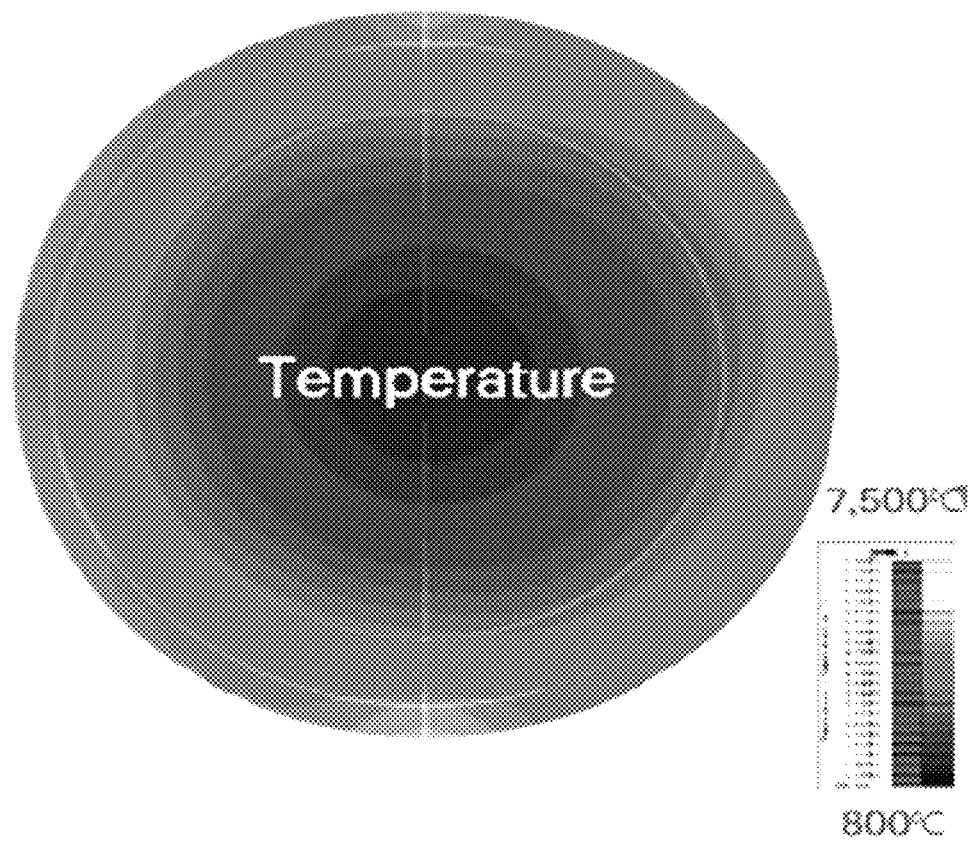

[FIG. 11b]
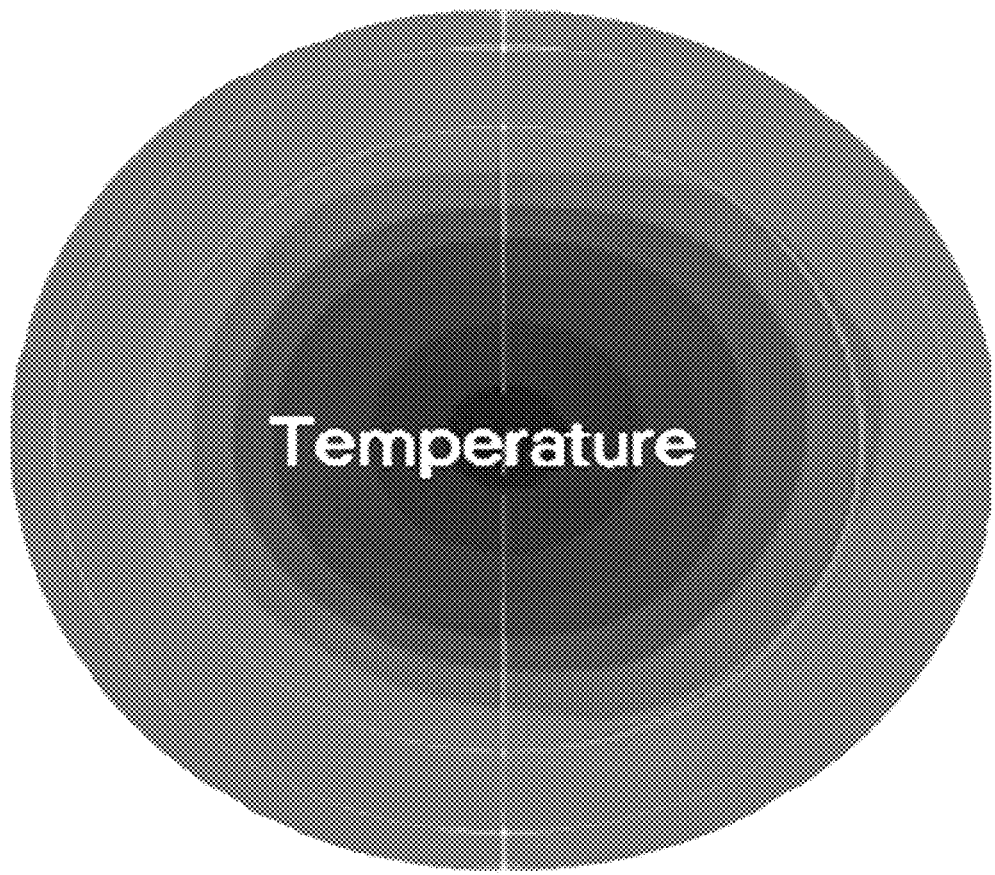

[FIG. 12a]
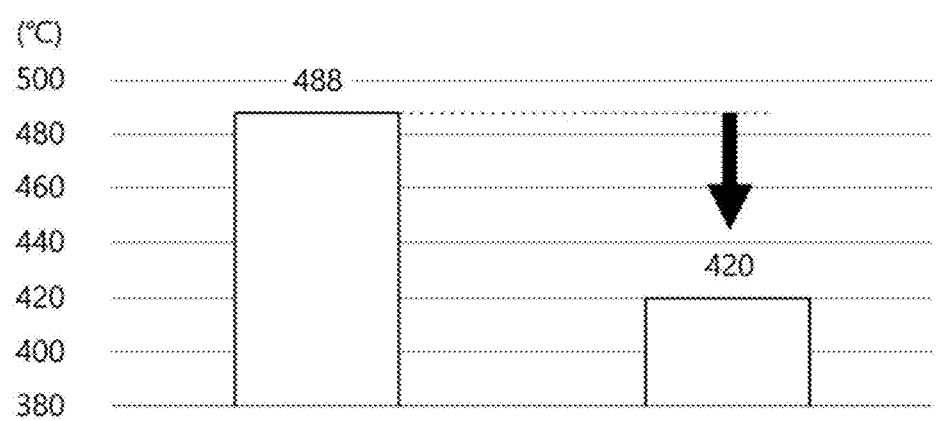

[FIG. 12b]
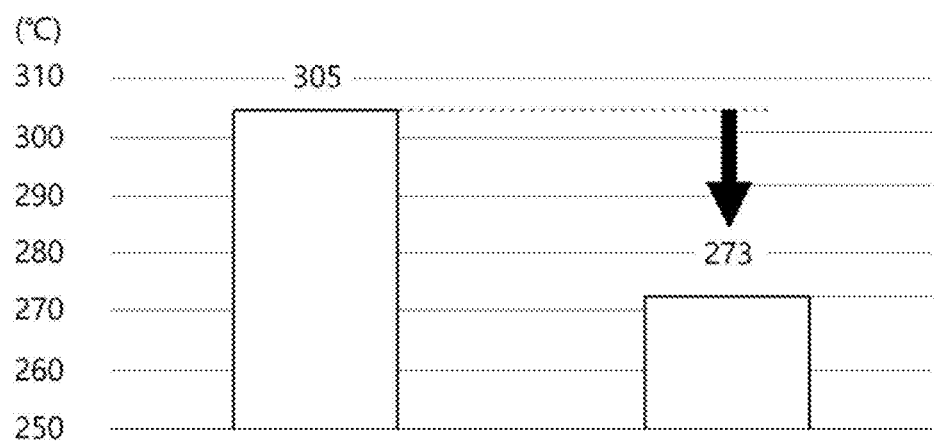

INGOT GROWING APPARATUS

CROSS-REFERENCE TO RELATED APPLICATION

This application is a National Stage of International Application No. PCT/KR2021/011957 filed Sep. 3, 2021, claiming priority to and the benefit of Korean Patent Application No. 10-2020-0126317, filed on Sep. 28, 2020, the disclosure of which is incorporated herein by reference in its entirety.

TECHNICAL FIELD

The present invention relates to an apparatus for growing an ingot.

BACKGROUND ART

Single crystal silicon is used as a basic material for most semiconductor components, and this material is manufactured as single crystals with high purity, and one of the manufacturing methods thereof is the Czochralski method.

In the Czochralski crystallization method, silicon is placed into a crucible, and the crucible is heated to melt the silicon. In addition, when a single crystal seed is pulled upward while rotating in a state of being in contact with the molten silicon, an ingot having a predetermined diameter is grown.

The continuous Czochralski method (CCz), which is one of the Czochralski methods, is a method of continuously growing an ingot while supplementing the consumed molten silicon by continuously injecting solid polysilicon or molten silicon into the crucible.

In order to grow an ingot through the continuous Czochralski method (CCz), it is important to heat the crucible and secure the uniformity of the temperature of the molten silicon that is injected into the crucible. In particular, if the uniformity of the temperature of the ingot growth region in which the ingot grows in the inside of the crucible is not secured, there is a problem in that the single crystal yield of the ingot is reduced.

Further, in order to secure the target temperature distribution of molten silicon in the ingot growth environment, the crucible is heated through electrical energy, and in the continuous Czochralski method, such power cost occupies a large proportion in the ingot manufacturing cost, and thus, there is a need to reduce power energy costs.

DISCLOSURE

Technical Problem

According to an exemplary embodiment of the present invention, in the process of heating molten silicon, it is directed to providing an apparatus for growing an ingot that improves the efficiency of power energy for heating a crucible while ensuring the uniformity of the temperature of molten silicon.

Technical Solution

The apparatus for growing an ingot according to an exemplary embodiment of the present invention may include a growth furnace in which a main crucible for receiving molten silicon in order to grow an ingot is disposed; a susceptor which is formed so as to surround the outer surface of the main crucible and includes a plurality of heating members which are electrically insulated from each other; and a heater which generates a magnetic field and heats the plurality of heating members through electromagnetic induction by the magnetic field, wherein the plurality of heating members may form loops along the outer surface of the main crucible.

In this case, the susceptor may be formed in a shape in which the plurality of heating members are divided in the horizontal direction parallel to the bottom surface of the growth furnace.

In this case, the susceptor may be formed in a shape in which the plurality of heating members are divided in the vertical direction perpendicular to the bottom surface of the growth furnace.

In this case, the plurality of heating members may be formed by including a graphite material.

In this case, the susceptor may further include a plurality of insulating members which are disposed between the plurality of heating members to couple the plurality of heating members.

In this case, the plurality of insulating members may be formed of a non-magnetic material.

In this case, the ends of the plurality of heating members may include curved portions.

In this case, the apparatus for growing an ingot may further include a blocking part which is disposed between the heater and the bottom surface of the growth furnace and blocks electromagnetic induction by the magnetic field to the heater and the lower side of the susceptor.

In addition, the apparatus for growing an ingot according to another exemplary embodiment of the present invention may include a growth furnace in which a main crucible for receiving molten silicon in order to grow an ingot is disposed; a susceptor which is formed so as to surround the outer surface of the main crucible; and a heater having a coil that is formed to be wound along the outer surface of the susceptor to generate a magnetic field, and heats the susceptor by electromagnetic induction by the magnetic field, wherein the coil may include a first part which is formed along the outer surface of the susceptor such that a direction in which the ingot is pulled and a direction of the magnetic field at the center of the coil are parallel; and a second part which extends obliquely from the first part at a predetermined angle with the first part.

In this case, the coil may be provided such that the first part and the second part form one turn with respect to the outer surface of the susceptor, and are formed to have a plurality of turns in the vertical direction of the susceptor.

In this case, the length of the second part may be within $1/18$ of the total length of the coil.

In this case, the heater may further include a shield which is formed to surround the outer surface of the coil and blocks exposure of the coil to the inner space of the growth furnace.

Advantageous Effects

In the apparatus for growing an ingot according to an exemplary embodiment of the present invention, each of the plurality of heating members individually generates current by electromagnetic induction to generate heat, thereby ensuring the uniformity of the temperature of molten silicon.

Further, in the apparatus for growing an ingot according to an exemplary embodiment of the present invention, the plurality of heating members are individually heated, thereby increasing the efficiency of power energy for heating the main crucible.

In the apparatus for growing an ingot according to another exemplary embodiment of the present invention, the first part of the coil is formed perpendicular to the pulling direction of the ingot to minimize the influence on the ingot growing into a single crystal due to the magnetic field generated in the coil, and thus, it is possible to increase the single crystal yield of the ingot.

DESCRIPTION OF DRAWINGS

FIG. 1 is a view schematically showing the apparatus for growing an ingot according to an exemplary embodiment of the present invention.

FIG. 2 is a perspective view mainly showing the susceptor of the apparatus for growing an ingot according to an exemplary embodiment of the present invention.

FIG. 3 is a cross-sectional view of FIG. 2.

FIG. 4 is a cross-sectional view mainly showing the susceptor of the apparatus for growing an ingot according to another exemplary embodiment of the present invention.

FIG. 5a is a perspective view showing a state in which the integrated susceptor is not divided.

FIG. 5b is a cross-sectional view of FIG. 5a.

FIG. 6b is a cross-sectional view of FIG. 6a.

FIG. 7a is a perspective view showing the heated state of a susceptor according to another exemplary embodiment of the present invention.

FIG. 7b is a cross-sectional view of FIG. 7a.

FIG. 8 is a side view schematically showing the coil of the apparatus for growing an ingot according to another exemplary embodiment of the present invention.

FIG. 9 is a view of the coil of FIG. 8 as viewed from above.

FIG. 10 is a perspective view schematically showing a spirally wound coil.

FIG. 11a is a view of the susceptor being heated by a coil according to another exemplary embodiment of the present invention as viewed from above.

FIG. 11b is a view of the susceptor being heated by the spirally wound coil of FIG. 10 as viewed from above.

FIG. 12a is a graph showing a difference between the temperature of the upper region of the susceptor according to the comparative example of FIG. 10 and the temperature of the upper region of the susceptor according to another exemplary embodiment of the present invention.

FIG. 12b is a graph showing a difference between the temperature of the central region of the susceptor according to the comparative example of FIG. 10 and the temperature of the central region of the susceptor according to another exemplary embodiment of the present invention.

Figure 5B:
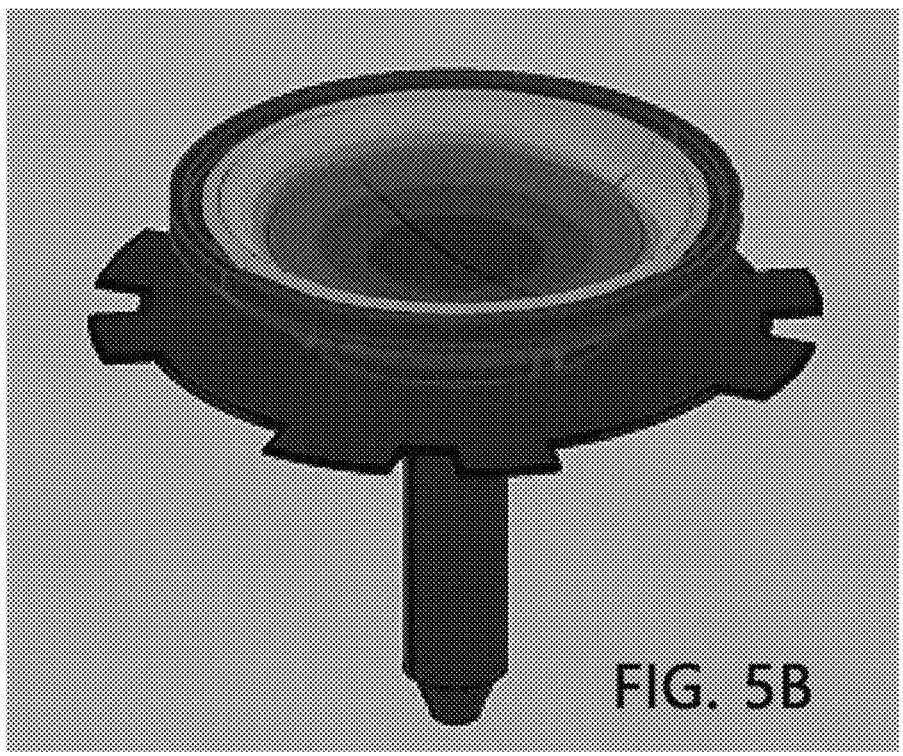

| 100: Apparatus for growing ingot | 10: Growth furnace |
| 120: Main crucible | 130: Susceptor |
| 131, 132: A plurality of heating members | 140: Heater |
| 141, 341: Coils | 342: First part |
| 343: Second part | |

MODES OF THE INVENTION

Terms and words used in the present specification and claims should not be construed as limited to their usual or dictionary definition, and they should be interpreted as a meaning and concept consistent with the technical idea of the present invention based on the principle that inventors may appropriately define the terms and concept in order to describe their own invention in the best way.

Accordingly, the exemplary embodiments described in the present specification and the configurations shown in the drawings correspond to preferred exemplary embodiments of the present invention, and do not represent all the technical spirit of the present invention, and thus, the configurations may have various examples of equivalent and modification that can replace them at the time of filing the present invention.

It is understood that the terms "include" or "have", when used in the present specification, are intended to describe the presence of stated features, integers, steps, operations, elements, components and/or a combination thereof but do not preclude the possibility of the presence or addition of one or more other features, integers, steps, operations, elements, components or a combination thereof.

The presence of an element in/on "front", "rear", "upper or above or top" or "lower or below or bottom" of another element includes not only being disposed in/on "front", "rear", "upper or above or top" or "lower or below or bottom" directly in contact with other elements, but also cases in which another element being disposed in the middle, unless otherwise specified. In addition, unless otherwise specified, that an element is "connected" to another element includes not only direct connection to each other but also indirect connection to each other.

Hereinafter, the apparatus for growing an ingot according to an exemplary embodiment of the present invention will be described with reference to the drawings. In the present specification, in terms of describing the apparatus for growing an ingot according to an exemplary embodiment of the present invention, the configurations that are not related to the contents of the present invention are not illustrated in detail or omitted for the sake of simplification of the drawings, and the apparatus for growing an ingot according to the present invention will be described by mainly focusing on the contents that are related to the spirit of the invention.

In the present specification, the arrow direction of the Z-axis is referred to as an upward direction of the growth path. The downward side means the opposite direction to the upward side.

FIG. 1 is a view schematically showing the apparatus for growing an ingot according to an exemplary embodiment of the present invention.

Referring to FIG. 1, the apparatus for growing an ingot 100 according to an exemplary embodiment of the present invention may include a growth furnace 110, a main crucible 120, a susceptor 130 and a heater 140.

The growth furnace 110 has an internal space 110a which is maintained in a vacuum state, and is formed such that an ingot I is grown in the internal space 110a. A main crucible 120 to be described below is disposed in the inner space 110a.

The growth furnace 110 is provided with a vacuum pump (not illustrated) and an inert gas supply part (not illustrated). The vacuum pump may maintain the internal space 110a in a vacuum atmosphere. In addition, the inert gas supply part supplies inert gas to the inner space 110a. The inert gas may be, for example, argon (Ar).

The main crucible 120 is accommodated in the inner space 110a of the growth furnace 110. The main crucible 120 may accommodate molten silicon M. The main crucible 120 is generally formed in a reverse dome shape. In addition, the main crucible 120 is not limited to being formed in a reverse dome shape, and may be formed in various shapes such as a cylindrical shape.

In addition, the main crucible 120 is formed of a quartz material. However, the main crucible 120 is not limited to being formed of a quartz material, and may include various materials that have heat resistance at a temperature of about 1,400° C. or higher and withstand a sudden change in temperature.

In addition, while the single crystal seed S is in contact with the molten silicon M accommodated in the main crucible 120, when a wire W which is connected to the upper side of the growth furnace 110 pulls up the single crystal seed S in the upward direction (Z axis), an ingot I having a predetermined diameter is grown along the pulling direction (Z axis) of the ingot (I).

In addition, the growth furnace 110 is provided with a preliminary melting part (not illustrated) for receiving and melting a solid silicon raw material. The preliminary melting part supplies the molten silicon to the main crucible 120.

The susceptor 130 surrounds the outer surface of the main crucible 120. The susceptor 130 supports the main crucible 120. The inner surface of the susceptor 130 has a shape corresponding to the outer surface of the main crucible 120. For example, if the main crucible 120 has a reverse dome shape, the susceptor 130 also has a reverse dome shape.

Accordingly, even if the main crucible 120 is formed of a quartz material and deformed at a high temperature, the susceptor 130 surrounds and supports the main crucible 120 such that it maintains a state in which the main crucible 120 accommodates the molten silicon M. The susceptor 130 will be described in detail below with reference to the drawings.

In addition, a susceptor support part 150 for supporting the susceptor 130 is disposed below the growth furnace 110. The upper end of the susceptor support part 150 has a shape corresponding to the lower end of the susceptor 130. In addition, while the susceptor support part 150 supports the susceptor 130 at the lower side of the growth furnace 110, the susceptor support part 150 rotates together with the susceptor 130. Accordingly, while the main crucible 120 accommodates the molten silicon M, the main crucible 120 is rotated together with the susceptor 130.

In addition, the growth furnace 110 is provided with a driving part (not illustrated) that provides a rotational force to rotate the susceptor support 150. The susceptor support part 150 is rotatably connected to the driving part. When the driving part receives power and provides a rotational force to the susceptor support part 150, the main crucible 120 is rotated together with the susceptor 130.

In addition, a heater 140 for heating the susceptor 130 is provided in the growth furnace 110. The heater 140 includes a coil 141 for receiving power to generate a magnetic field and a shield 142 for surrounding the coil 141.

The coil 141 generates a current in the susceptor 130 by electromagnetic induction by a magnetic field. In this case, the current generated in the susceptor 130 is converted into thermal energy. Accordingly, the heater 140 heats the susceptor 130. The heat of the susceptor 130 is conducted to the main crucible 120, and the susceptor 130 heats the main crucible 120.

The shield 142 supports the coil 141 such that the coil 141 is maintained in a certain shape. The shield 142 blocks the coil from being exposed to the inner space 110*a* of the growth furnace 110. Accordingly, since the shield 142 blocks the coil 141 from being exposed to the inner space 110*a* of the growth furnace 110, when the coil 141 receives power to form a magnetic field, it is possible to prevent an arc discharge from occurring due to a plasma phenomenon in the vacuum state or an arc discharge from being generated by the coil 141 coming into contact with an inert gas (e.g., argon) that is present in the inner space 110*a*.

The heater 140 is formed to surround the outer surface of the susceptor 130. In addition, the heater 140 may heat the susceptor 130 by electromagnetic induction, which is an induction heating method. When the heater 140 uses an induction heating method, the heater 140 is disposed to be spaced apart from the outer surface of the susceptor 130 such that the heat of the susceptor 130 is prevented from being conducted back to the heater 140.

In addition, a heater support part 160 for supporting the heater 140 is disposed below the growth furnace 110. The heater support part 160 is generally formed in a cylindrical shape. The susceptor support part 150 is disposed inside the heater support part 160 having the cylindrical shape. In addition, the upper end of the heater support part 160 is formed in a shape corresponding to the lower end of the heater 140, and the heater 140 is disposed on the upper end of the heater support part 160.

In addition, a blocking part 170 is provided below the heater 140 to block electromagnetic induction by a magnetic field generated from the heater 140.

The blocking part 170 is disposed between the heater 140 and the bottom surface 112 of the growth furnace 110. The blocking part 170 is formed of a non-magnetic material such that heat is not generated by electromagnetic induction by a magnetic field generated from the heater 140. In addition, the blocking part 170 is coupled to the heater support part 160.

In addition, the blocking part 170 is disposed between the lower side of the susceptor 130 and the bottom surface 112 of the growth furnace 110 such that it blocks the heat generated from the susceptor 130 from being transferred to an apparatus which is disposed on the bottom surface 112 of the growth furnace 110 or the susceptor 130 and the bottom surface 112.

In addition, a through-hole (not illustrated) through which the susceptor support part 150 passes is formed in the blocking part 170. Accordingly, since the susceptor support part 150 passes through the blocking part 170 through the through-hole, the blocking part 170 is prevented from interfering with the rotating susceptor support part 150.

FIG. 2 is a perspective view mainly showing the susceptor of the apparatus for growing an ingot according to an exemplary embodiment of the present invention, and FIG. 3 is a cross-sectional view of FIG. 2.

Referring to FIGS. 2 and 3, the susceptor 130 includes a plurality of heating members 131, 132 and a plurality of insulating members 133 that are disposed between the plurality of heating members 131, 132.

The plurality of heating members 131, 132 form the outer shape of the reverse dome-shaped susceptor 130. The plurality of heating members 131, 132 are electrically insulated from each other. In addition, the plurality of heating members 131, 132 are formed by including a graphite material. However, the plurality of heating members 131, 132 are not limited to being formed of graphite material, and may include various materials having strong heat resistance.

In addition, the susceptor 130 may be formed in a shape in which the plurality of heating members 131, 132 are divided in the horizontal direction (Z-axis) which is parallel to a bottom surface 112 of the growth furnace 110 (refer to FIG. 1). In addition, the plurality of heating members 131, 132 are provided with first heating members 131 for forming sidewalls of the susceptor 130 and a second heating member 132 for forming a bottom of the susceptor 130.

The first heating members 131 may be formed in a ring shape surrounding the outer surface of the main crucible 120 (refer to FIG. 1). In addition, the first heating members 131 form loops through which a current induced by a magnetic field flows along the outer surface of the main crucible 120 (refer to FIG. 1). Accordingly, the current induced by a magnetic field flows through the first heating members 131 individually such that the temperature uniformity of the entire susceptor 130 is secured.

In addition, the size of the first heating members 131 increases from the upper side to the lower side. Accordingly, it is controlled such that heat is not concentrated on the upper side of the susceptor 130.

In addition, according to various exemplary embodiments of the present invention, by designing the sizes of the first heating members 131 differently, the degree of heat generation in the upper region, the central region or the lower region of the sidewalls of the susceptor 130 may be adjusted.

In addition, according to an exemplary embodiment of the present invention, the first heating members 131 are composed of three, but the present invention is not limited thereto, and they may be composed of four or more.

In addition, when the ends 131a, 131b of the first heating members 131 are formed in a pointed shape, a current is concentrated in the ends 131a, 131b to generate excessive heat.

In order to solve this problem, the ends 131a, 131b of the first heating member 131 are provided with curved portions 131a, 131b. Accordingly, current is prevented from intensively flowing through the curved portions 131a, 131b of the first heat generating member 131 by electromagnetic induction, and the curved portions 131a, 131b are prevented from being excessively heated.

The plurality of insulating members 133 are disposed between the plurality of heating members 131, 132 to couple the plurality of heating members 131, 132. The plurality of insulating members 133 together with the first heating member 131 constitute sidewalls of the susceptor 130.

In addition, the plurality of insulating members 133 are formed of a non-magnetic material. For example, the plurality of insulating members 133 may be formed of a ceramic material. Accordingly, the plurality of insulating members 133 block the plurality of heating members 131, 132 from being electrically connected to each other.

FIG. 4 is a cross-sectional view mainly showing the susceptor of the apparatus for growing an ingot according to another exemplary embodiment of the present invention.

Referring to FIG. 4, the susceptor 230 of the apparatus for growing an ingot according to another exemplary embodiment of the present invention includes a plurality of heating members 231, 232 and a plurality of insulating members 233 that are disposed between the plurality of heating members 231, 232. In addition, the description of another exemplary embodiment of the present invention is replaced with the same or similar content to the components of the above-described exemplary embodiment.

In the susceptor 230, the plurality of heating members 231, 232 are formed in a shape which is divided in the vertical direction (Z axis) perpendicular to the bottom surface 112 (refer to FIG. 1) of the growth furnace 110 (refer to FIG. 1). Accordingly, in the plurality of heating members 231, 232, the current by induction of the magnetic field flows individually, and excessive heat or non-heating is prevented in a specific portion of the susceptor 230.

According to another exemplary embodiment of the present invention, the susceptor 230 is composed of three heating members 231, 232, but the present invention is not limited thereto, and it may include four or more.

Figure 6A:
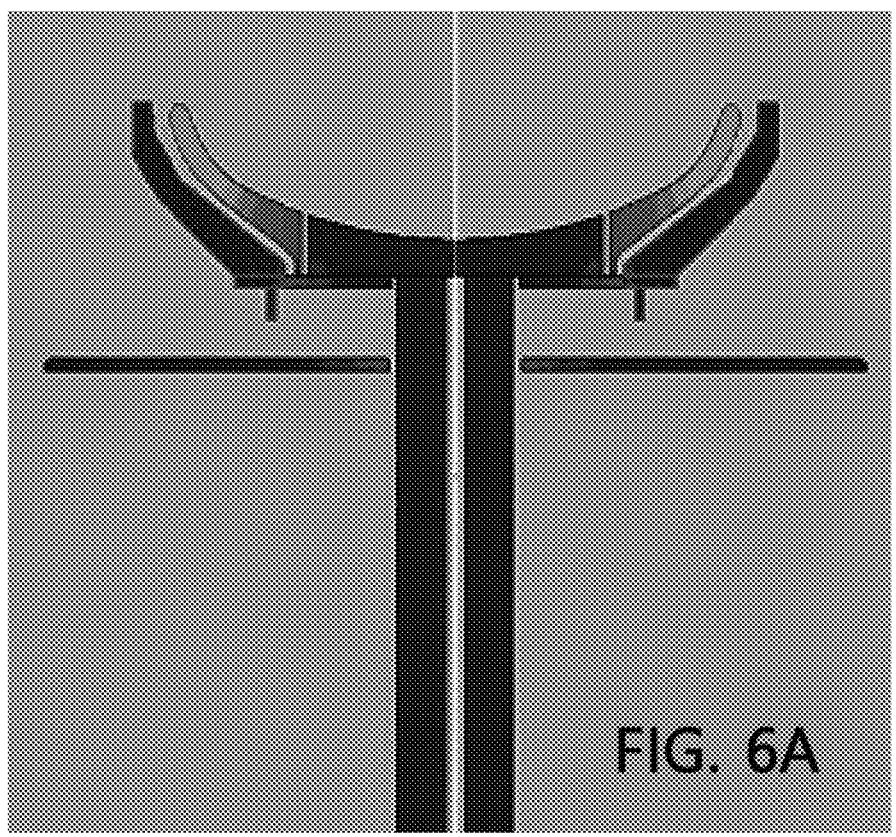
FIG. 6a is a perspective view showing a state in which the susceptor according to an exemplary embodiment of the present invention is heated.
Figure 6B:
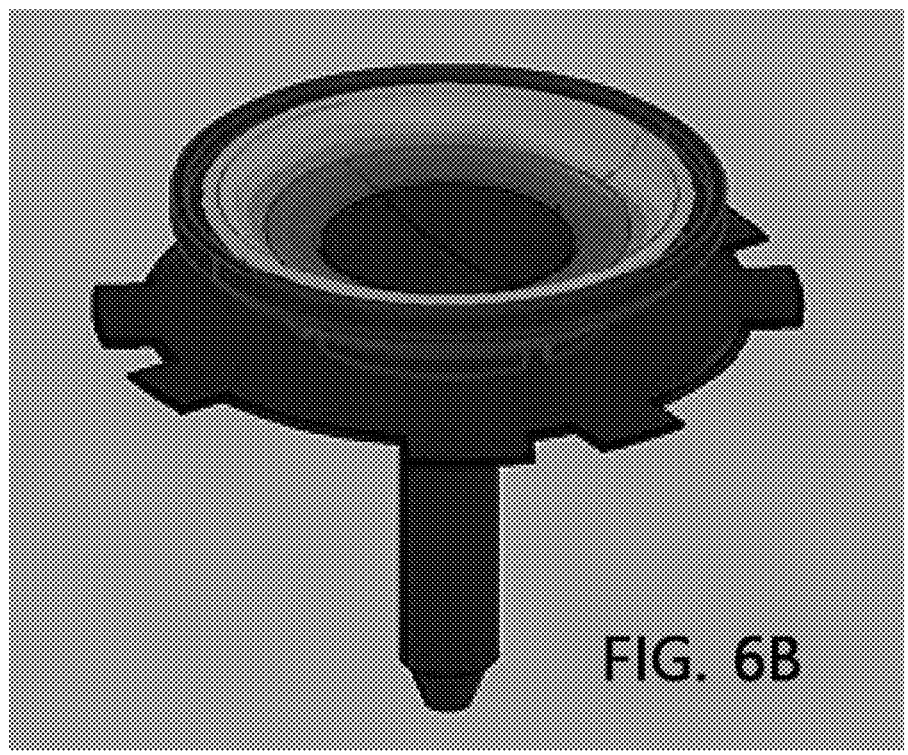
Figure 7B:
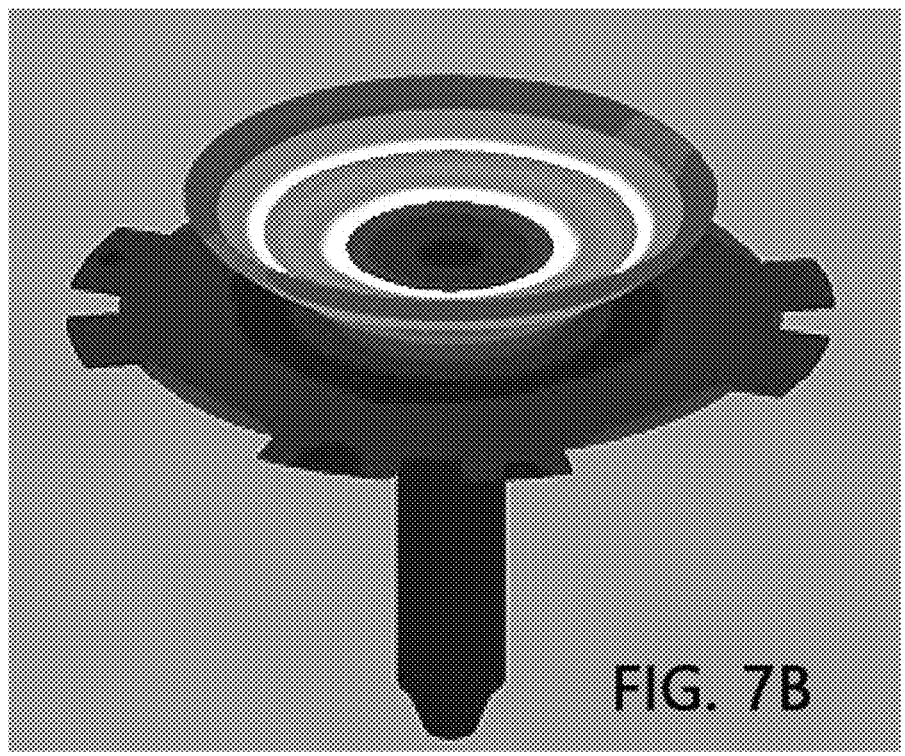

FIG. 5a is a perspective view showing a state in which the integrated susceptor is not divided, FIG. 5b is a cross-sectional view of FIG. 5a. In addition, FIG. 6a is a perspective view showing a state in which the susceptor according to an exemplary embodiment of the present invention is heated, and FIG. 6b is a cross-sectional view of FIG. 6a. In addition, FIG. 7a is a perspective view showing the heated state of a susceptor according to another exemplary embodiment of the present invention, and FIG. 7b is a cross-sectional view of FIG. 7a.

FIGS. 5a to 7b show that the temperature change due to the heat exchange of the susceptor is excluded according to the flux simulation, and only the temperature of the susceptor generated by the induced current is displayed, resulting a temperature higher than the melting point of silicon. Under these conditions, the temperature according to the simulation corresponds to a maximum of about 6,000° C., but in the actual ingot growth apparatus, it is noted that it is different from the temperature range shown in the drawings.

Referring to FIGS. FIGS. 5a to 7b, the thermal performances of a susceptor integrated without division (hereinafter, referred to as "an integrated susceptor"), the susceptor according to an exemplary embodiment of the present invention, and the susceptor according to another exemplary embodiment of the present invention will be compare.

First of all, as illustrated in FIGS. 5a and 5b, when the integrated susceptor is heated by electromagnetic induction by a heater, the temperature of the upper end of the integrated susceptor is higher than the temperature of other portions of the integrated susceptor. That is, the temperature decreases from the upper side to the lower side of the integrated susceptor. This is because a loop is formed at the upper end of the integrated susceptor.

In addition, as illustrated in FIGS. 6a and 6b, the temperature of the upper end of the susceptor 130 (refer to FIG. 3) according to an exemplary embodiment of the present invention has a small difference from the temperature of other portions.

In addition, it can be seen that the temperature of the sidewalls of the susceptor according to an exemplary embodiment of the present invention is higher than the temperature of the sidewalls of the integrated susceptor and is overall uniform. This is because, as described above, the plurality of heating members are individually heated by electromagnetic induction.

In this way, the susceptor according to an exemplary embodiment of the present invention may increase the single crystal yield of an ingot by securing the uniformity of the generated temperature.

In addition, since the susceptor according to an exemplary embodiment of the present invention implements a higher temperature than the integrated susceptor receiving the same power, it is possible to increase the efficiency of power energy used in the ingot growing apparatus.

In addition, as illustrated in FIGS. 7a and 7b, the sidewalls of the susceptor 230 (refer to FIG. 4) according to another exemplary embodiment of the present invention are heated at a higher temperature in a wider portion than the sidewalls of the integrated susceptor.

This is because the plurality of heating members of the susceptor 230 (refer to FIG. 4) according to another exemplary embodiment of the present invention are individually heated by electromagnetic induction.

Meanwhile, although the susceptor 230 (refer to FIG. 4) according to another exemplary embodiment of the present invention generates heat at a lower temperature than the susceptor 130 (refer to FIG. 3) according to an exemplary embodiment of the present invention, heat is generated at a high temperature in wide portions compared to the integrated susceptor, and thus, when the susceptor is composed of a plurality of divided heating members, heat generation performance is increased.

FIG. 8 is a side view schematically showing the coil of the apparatus for growing an ingot according to another exemplary embodiment of the present invention, and FIG. 9 is a view of the coil of FIG. 8 as viewed from above.

The apparatus for growing an ingot according to another exemplary embodiment of the present invention is externally similar to the apparatus for growing an ingot according to an exemplary embodiment of the present invention as illustrated in FIG. 1. Referring to FIGS. 8 and 9, the coil 341 of the apparatus for growing an ingot according to another exemplary embodiment of the present invention will be mainly reviewed.

First of all, the apparatus for growing an ingot according to another exemplary embodiment of the present invention is provided with a susceptor 330. As described above, the susceptor 330 is formed in a shape in which a plurality of heating members are divided in the horizontal direction (X-axis) or the vertical direction (Z-axis).

The coil 341 includes a first part 342 which is formed along the outer surface of the susceptor 330 and a second part 343 which extends from the first part 342 at a predetermined angle with the first part 342 such that the direction (Z axis, refer to FIG. 1) in which the ingot I (refer to FIG. 1) is pulled up is parallel to the direction C of the magnetic field at the center O of the coil 341

In this case, the coil 341 is provided such that the first part 342 and the second part 343 form one turn with respect to the outer surface of the susceptor 330. In addition, the coil 341 is formed such that the first part 342 and the second part 343 have a plurality of turns in the vertical direction (Z-axis) of the susceptor 330. Herein, the vertical direction (Z axis) of the susceptor 330 is the same as the direction in which the ingot is pulled up (Z axis, refer to FIG. 1).

As illustrated in FIG. 8, when the susceptor 330 is viewed from the side, the first part 342 is composed of a first turn part 342a which is disposed above the coil 341, a second turn part 342b which is disposed to be spaced apart from the lower side of the first turn part 342a and a third turn part 342c which is disposed to be spaced apart from the lower side of the second turn part 342b. In addition, the first part 342 is not limited to being composed of a first turn part 342a, a second turn part 342b and a third turn part 342c, and as illustrated in FIG. 8, it is composed of a plurality of turn parts, such as a fourth turn part, a fifth turn part and the like.

In addition, the first part 342 is configured such that the first turn part 342a, the second turn part 342b and the third turn part 342c are sequentially connected, but when viewed from the side of the susceptor 330, these are configured to be spaced apart from each other.

The second part 343 is composed of a first connection part 343a which is disposed between one side of the first turn part 342a and the other side of the second turn part 342b and a second connection part 343b which is disposed between one side of the second turn part 342b and the other side of the third turn part 342c. In addition, when the first part 342 is composed of the plurality of turn parts, the second part 343 is composed of the plurality of connection parts to correspond to the plurality of turn parts.

The first connection part 343a is formed to be inclined from one side of the first turn part 342a toward the other side of the second turn part 342b. That is, the first turn part 342a is electrically connected to the second turn part 342b through the first connection part 343a, and the first turn part 342a is provided to be disposed in the horizontal direction (X axis). Herein, the horizontal direction (X-axis) is a direction perpendicular to the direction C of the magnetic field at the center of the coil 341.

The second connection part 343b is formed to be inclined from one side of the second turn part 342b toward the other side of the third turn part 342c. That is, the second turn part 342b is electrically connected to the third turn part 342c through the second connection part 343b, and the second turn part 342b is provided to be disposed in the horizontal direction (X-axis). Similarly, the plurality of turn parts are provided to be arranged in the horizontal direction (X-axis).

Accordingly, since the first part 342 is formed in the horizontal direction (X-axis) that is perpendicular to the direction C of the magnetic field at the center of the coil 341, the force generated by the magnetic field generated from the coil 341 is not inclined with a direction in which the single crystal of an ingot grows. That is, as the first part 342 of the coil 341 is arranged in the horizontal direction (X-axis), the yield of the single crystal of the ingot may be increased.

In addition, as illustrated in FIG. 9, when the coil 341 is viewed from the upper side, the first connection part 343a of the second part 343 is disposed in the range of a predetermined angle from the center O of the concentric circle of the coil 341. The predetermined angle may be approximately 20°. That is, since the second part 343 is disposed in a range of about 20° from the center O of the concentric circle of the coil 341, the length of the second part 343 is within ⅟18 of the total length of the coil 341. The length of the second part 343 is determined according to the thickness of the coil 341. For example, as the thickness of the coil 341 decreases, the length of the second part 343 decreases.

As described above, as the coil 341 is formed to minimize the length of the second part 343, the influence of the force by the magnetic field generated from the second part 343 on the single crystal of an ingot I (refer to FIG. 1) is minimized.

FIG. 10 is a perspective view schematically showing a spirally wound coil. In addition, FIG. 11a is a view of the susceptor being heated by a coil according to another exemplary embodiment of the present invention as viewed from above, and FIG. 11b is a view of the susceptor being heated by the spirally wound coil of FIG. 10 as viewed from above. In addition, FIG. 12a is a graph showing a difference between the temperature of the upper region of the susceptor according to the comparative example of FIG. 10 and the temperature of the upper region of the susceptor according to another exemplary embodiment of the present invention, and FIG. 12b is a graph showing a difference between the temperature of the central region of the susceptor according to the comparative example of FIG. 10 and the temperature of the central region of the susceptor according to another exemplary embodiment of the present invention.

With reference to FIGS. 10 to 12b, the performances of a spiral wound coil according to a comparative example (hereinafter, referred to as "a coil according to a comparative example") and a coil according to another exemplary embodiment of the present invention will be compared.

First of all, as illustrated in FIG. 10, the coil 30 according to the comparative example is spirally wound a plurality of times along the outer surface of the susceptor 20.

In addition, the susceptor which is heated by the coil according to another exemplary embodiment of the present invention as illustrated in FIG. 11a is generally symmetrical with respect to the center of the concentric circle of the coil compared to the coil according to the comparative example as illustrated in FIG. 11b. That is, the coil according to another exemplary embodiment of the present invention heats the susceptor such that the temperature of the susceptor is uniform compared to the coil according to the comparative example. Accordingly, the coil according to another exemplary embodiment of the present invention secures the uniformity of the temperature of the susceptor.

In addition, as illustrated in FIG. 12a, the temperature deviation of the upper region of the susceptor heated by the coil according to the comparative example is approximately 488° C., and the temperature deviation of the upper region of the susceptor heated by the coil according to another exemplary embodiment of the present invention is approximately 420° C. That is, the coil according to another exemplary embodiment of the present invention has a smaller temperature deviation of the upper region of the susceptor than the coil according to the comparative example.

In addition, as illustrated in FIG. 12b, the temperature deviation of the central region of the susceptor heated by the coil according to the comparative example is approximately 305° C., and the temperature deviation of the central region of the susceptor heated by the coil according to another exemplary embodiment of the present invention is approximately 273° C. That is, the coil according to another exemplary embodiment of the present invention has a smaller temperature variation in the central region of the susceptor than the coil according to the comparative example. In addition, as described above, since it is a simulation result that does not consider the heat transfer to the main crucible and the molten silicon accommodated in the main crucible, it is noted that there is a difference from the actual temperature at which the apparatus for growing an ingot is operated.

In this way, the coil according to another exemplary embodiment of the present invention secures the uniformity of the temperature of the susceptor compared to the coil according to the comparative example. In addition, since the coil according to another exemplary embodiment of the present invention secures the uniformity of the temperature of the susceptor, it is possible to prevent the excessive consumption of power energy in the process of securing the uniformity of the temperature of the susceptor.

Although the exemplary embodiments of the present invention have been described, the spirit of the present invention is not limited by the exemplary embodiments presented herein, and a person skilled in the art who understands the spirit of the present invention may easily suggest other exemplary embodiments by modifying, changing, deleting or adding components within the scope of the same spirit, but this will also be within the spirit of the present invention.

The invention claimed is:

1. An apparatus for growing an ingot, comprising:
a growth furnace in which a main crucible for receiving molten silicon in order to grow an ingot is disposed;
a susceptor which is formed so as to surround the outer surface of the main crucible and comprises a plurality of heating members which are electrically insulated from each other; and
a heater which generates a magnetic field and heats the plurality of heating members through electromagnetic induction by the magnetic field,
wherein the plurality of heating members form loops along the outer surface of the main crucible.

2. The apparatus of claim 1, wherein the susceptor is formed in a shape in which the plurality of heating members are divided in the horizontal direction parallel to the bottom surface of the growth furnace.

3. The apparatus of claim 1, wherein the susceptor is formed in a shape in which the plurality of heating members are divided in the vertical direction perpendicular to the bottom surface of the growth furnace.

4. The apparatus of claim 1, wherein the plurality of heating members are formed by comprising a graphite material.

5. The apparatus of claim 1, wherein the susceptor further comprises a plurality of insulating members which are disposed between the plurality of heating members to couple the plurality of heating members.

6. The apparatus of claim 5, wherein the plurality of insulating members are formed of a non-magnetic material.

7. The apparatus of claim 1, wherein the ends of the plurality of heating members comprise curved portions.

8. The apparatus of claim 1, further comprising:
a blocking part which is disposed between the heater and the bottom surface of the growth furnace and blocks electromagnetic induction by the magnetic field to the heater and the lower side of the susceptor.

9. An apparatus for growing an ingot, comprising:
a growth furnace in which a main crucible for receiving molten silicon in order to grow an ingot is disposed;
a susceptor which is formed so as to surround the outer surface of the main crucible; and
a heater having a coil that is formed to be wound along the outer surface of the susceptor to generate a magnetic field, and heats the susceptor by electromagnetic induction by the magnetic field,
wherein the coil comprises:
a first part which is formed along the outer surface of the susceptor such that a direction in which the ingot is pulled and a direction of the magnetic field at the center of the coil are parallel; and
a second part which extends obliquely from the first part at a predetermined angle with the first part.

10. The apparatus of claim 9, wherein the coil is provided such that the first part and the second part form one turn with respect to the outer surface of the susceptor, and are formed to have a plurality of turns in the vertical direction of the susceptor.

11. The apparatus of claim 9, wherein the length of the second part is within $1/18$ of the total length of the coil.

12. The apparatus of claim 9, wherein the heater further comprises a shield which is formed to surround the outer surface of the coil and blocks exposure of the coil to the inner space of the growth furnace.

* * * * *